(12) United States Patent
Sakai et al.

(10) Patent No.: US 7,449,926 B2
(45) Date of Patent: Nov. 11, 2008

(54) CIRCUIT FOR ASYNCHRONOUSLY RESETTING SYNCHRONOUS CIRCUIT

(75) Inventors: Katsuhiko Sakai, Kasugai (JP); Atsuhiro Sengoku, Kasugai (JP); Teruhiko Saitou, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/443,110

(22) Filed: May 31, 2006

(65) Prior Publication Data

US 2007/0170960 A1    Jul. 26, 2007

(30) Foreign Application Priority Data

Jan. 26, 2006    (JP)    ............... 2006-017773

(51) Int. Cl.
   *H03L 7/00*    (2006.01)
(52) U.S. Cl. ............... 327/142; 327/143
(58) Field of Classification Search .......... 327/142, 327/143; 711/166; 714/E11.138
   See application file for complete search history.

(56) References Cited

U.S. PATENT DOCUMENTS

| | | | | |
|---|---|---|---|---|
| 4,572,966 A | * | 2/1986 | Hepworth | ............... 327/143 |
| 5,576,650 A | * | 11/1996 | Hirotani et al. | ............... 327/142 |
| 5,774,649 A | * | 6/1998 | Goh | ............... 714/55 |
| 5,874,843 A | * | 2/1999 | Wang | ............... 327/143 |
| 6,076,172 A | * | 6/2000 | Kimura et al. | ............... 714/24 |
| 7,231,533 B2 | * | 6/2007 | Darmawaskita et al. | ...... 713/323 |
| 7,239,187 B2 | * | 7/2007 | Ishikawa | ............... 327/143 |

FOREIGN PATENT DOCUMENTS

JP    2002-108510 A    4/2002

* cited by examiner

*Primary Examiner*—Kenneth B. Wells
(74) *Attorney, Agent, or Firm*—Arent Fox LLP

(57) ABSTRACT

A reset signal generation circuit for generating a reset signal synchronously or asynchronously to a clock signal in accordance with an operation state. An operation detection circuit detects operation of a CPU and generates an operation detection signal. A signal control circuit generates a first reset signal synchronously or asynchronously to an internal clock signal based on the operation detection signal and a system reset signal. The first reset signal is provided to synchronous circuits including the CPU.

7 Claims, 7 Drawing Sheets

CIRCUIT FOR ASYNCHRONOUSLY RESETTING SYNCHRONOUS CIRCUIT

CROSS-REFERENCE TO RELATED APPLICATIONS

This application is based upon and claims the benefit of priority from the prior Japanese Patent Application No. 2006-017773, filed on Jan. 26, 2006, the entire contents of which are incorporated herein by reference.

BACKGROUND OF THE INVENTION

The present invention relates to a semiconductor device, and more particularly, to a reset signal generation circuit for switching the generation timing of a reset signal between timings that are asynchronous and synchronous with a system clock signal.

A semiconductor device, such as a system LSI, includes various circuits, such as a ROM and a RAM, and also includes a reset signal generation circuit for resetting each of those circuits. The reset signal generation circuit generates a reset signal for resetting each circuit when activated or when the power supply voltage decreases.

A semiconductor device, such as a system LSI, includes a CPU, a ROM for storing programs that are executed by the CPU, a RAM for temporarily storing data, and peripheral circuits such as an I/O or a counter. When the power supply voltage of the semiconductor device becomes less than the operable voltage, the setting of an internal circuit becomes unstable. In such a case, the semiconductor device may operate abnormally or the CPU may operate erroneously. To prevent this, the reset signal generation circuit of the semiconductor device monitors the power supply voltage and generates a reset signal when the power supply voltage decreases.

A synchronous circuit, such as a RAM, may be initialized by a reset signal that is asynchronous to a system clock signal. However, if a memory, such as a RAM, is provided with an asynchronous reset signal during operation, the data stored in the memory may be lost. To maintain the stored data of the memory, such a synchronous circuit must be reset based on a reset signal that is synchronous to a system clock signal. Japanese Laid-Open Patent Publication No. 2002-108510 describes a reset circuit for generating, in a low-voltage state, a reset signal that is asynchronous to the system clock signal when the system clock signal is not generated. The reset circuit also generates a reset signal that is synchronous to the system clock signal when the system clock signal is generated.

SUMMARY OF THE INVENTION

The above reset circuit generates a synchronous reset signal when a system clock signal is generated irrespective of the operation state of an internal circuit. Thus, for example, the circuit may not be initialized when the internal circuit is operating abnormally and should immediately be initialized by an asynchronous reset signal. In such a case, the entire semiconductor device may fail to be initialized in this case.

The present invention provides a reset signal generation circuit for generating a reset signal that is synchronous or asynchronous to a clock signal in accordance with the operation state.

One aspect of the present invention is a reset signal generation circuit for generating a first reset signal provided to a synchronous circuit that operates in accordance with a clock signal. The reset signal generation circuit includes an operation detection circuit for detecting an operation state of the synchronous circuit and generating an operation detection signal. A signal control circuit, connected to the operation detection circuit, generates the first reset signal that is synchronous or asynchronous to the clock signal based on the operation detection signal.

A further aspect of the present invention is a reset signal generation circuit for generating a first reset signal provided to a synchronous circuit that operates in accordance with a clock signal. The reset signal generation circuit includes an oscillation circuit for generating a system clock signal. An oscillation control circuit, connected to the oscillation circuit, determines whether an oscillation stoppage factor that stops oscillation of the oscillation circuit has been eliminated and starts oscillation of the oscillation circuit when the oscillation stoppage factor has been eliminated. A clock generation circuit, connected to the oscillation circuit, generates the clock signal from the system clock signal. An oscillation stabilization control circuit, connected to the oscillation circuit, controls a first time period during which oscillation of the oscillation circuit is stabilized. A determination circuit, connected to the oscillation stabilization control circuit, determines whether operation of the oscillation circuit is normal or abnormal after at least the first time period elapses. A signal control circuit, connected to the determination circuit, generates the first reset signal synchronously to the clock signal based on a system reset signal when the determination circuit determines that the operation of the oscillation circuit is normal and generates the first reset signal asynchronously to the clock signal based on the system reset signal when the determination circuit determines that the operation of the oscillation circuit is abnormal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
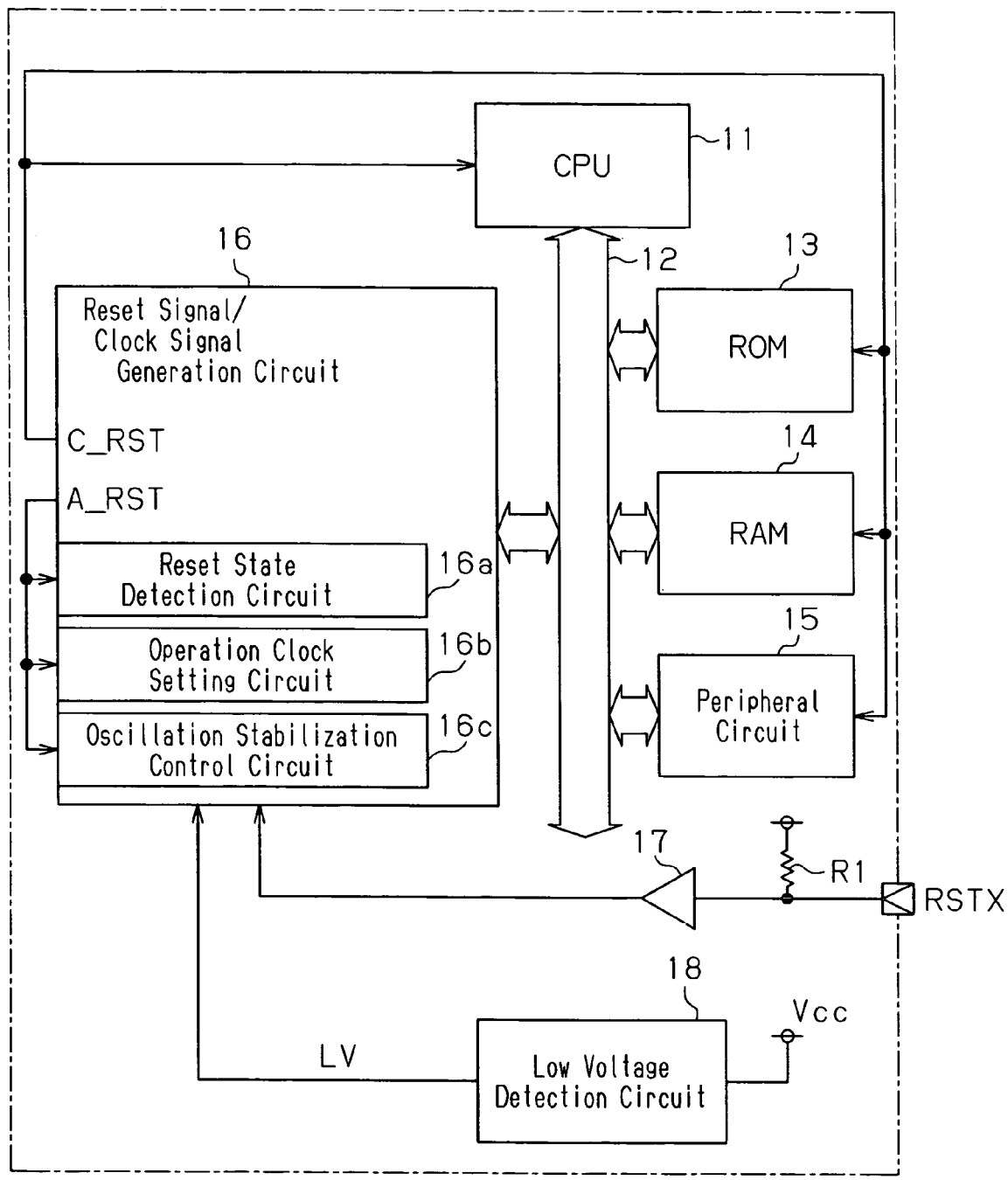
FIG. 1 is a schematic block diagram of a semiconductor device according to a first embodiment of the present invention.

In the drawings, like numerals are used for like elements throughout.

A reset signal generation circuit 16 according to a first embodiment of the present invention will now be described with reference to the drawings.

As shown in FIG. 1, in a semiconductor device, a bus 12 connects a CPU 11, a ROM 13, a RAM 14, a peripheral circuit 15, and a reset signal/clock signal generation circuit (hereafter referred to as a "reset signal generation circuit") 16 to one another. The ROM 13 is a rewritable nonvolatile memory such as a flash memory. The ROM 13 stores programs that are executed by the CPU 11 and parameters necessary for execution of the programs. The RAM 14 stores temporal data that is generated when the CPU 11 executes a program. The CPU 11 controls the peripheral circuit 15 and the reset signal generation circuit 16 in accordance with the program and parameters read from the ROM 13. The peripheral circuit 15 includes a timer circuit, a counter circuit, and other circuits realizing predetermined functions.

Figure 2:
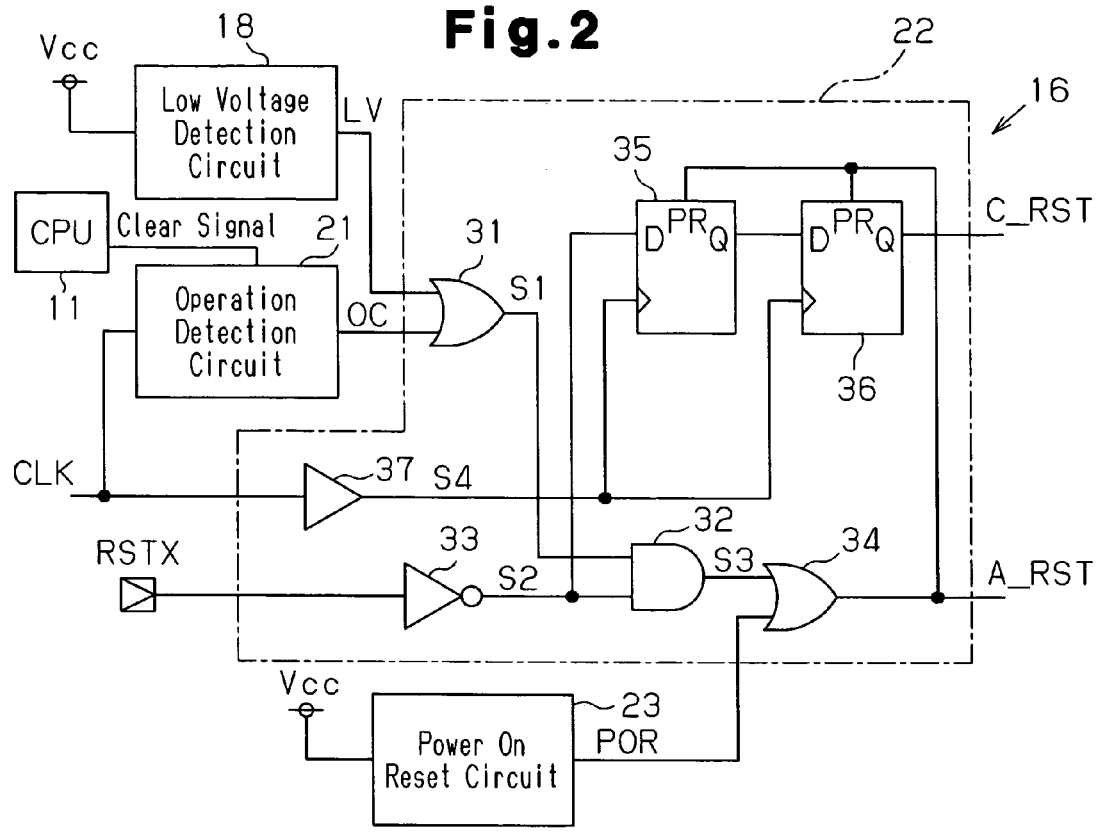
FIG. 2 is a schematic circuit block diagram of a reset signal generation circuit that is used in the semiconductor device of FIG. 1.

The CPU 11, the ROM 13, the RAM 14, and the peripheral circuit 15 are synchronous circuits, which are initialized by a reset signal that is synchronous to an internal clock signal CLK (refer to FIG. 2). In this case, the timing at which the reset signal is generated is controlled by the CPU 11. Thus, the setting data of the RAM 14 and the peripheral circuit 15 are stored in the ROM 13. Further, the CPU 11, the ROM 13, the RAM 14, and the peripheral circuit 15 are initialized based on a reset signal that is asynchronous to the internal clock signal CLK. In this case, a system reset signal RSTX is provided from a device external to the semiconductor device to an internal circuit of the semiconductor device, and the data of the RAM 14 and the peripheral circuit 15 are not stored.

The reset signal generation circuit 16 includes a reset state detection circuit 16a, an operation clock setting circuit 16b, and an oscillation stabilization control circuit 16c. These circuits 16a to 16c are asynchronous circuits.

The reset signal generation circuit 16 generates the internal clock signal CLK based on a system clock signal (not shown), which is either input from a device external to the semiconductor device or generated by an oscillation circuit. Further, the reset signal generation circuit 16 is provided with a system reset signal RSTX from a device external to the semiconductor device via a buffer circuit 17. A pull-up resistor R1 is connected to an input terminal of the buffer circuit 17. The reset signal generation circuit 16 generates a first reset signal C_RST in response to the system reset signal RSTX. The reset signal generation circuit 16 further generates a second reset signal A_RST, which is asynchronous to the internal clock signal CLK, in response to the system reset signal RSTX. The reset signal generation circuit 16 then provides the internal clock signal CLK to the synchronous circuits including the CPU 11. The reset signal generation circuit 16 further provides the second reset signal A_RST to the circuits 16a to 16c that are asynchronous circuits. Further, the reset signal generation circuit 16 detects the operation state of the CPU 11 and generates a first reset signal C_RST that is synchronous or asynchronous to the internal clock signal CLK based on the detection result. The reset signal generation circuit 16 then provides the first reset signal C_RST to the synchronous circuits such as the CPU 11.

The reset signal generation circuit 16 is connected to a low voltage detection circuit 18. The low voltage detection circuit 18 monitors the power supply voltage Vcc, which is supplied as an operation voltage for the semiconductor device, and generates a voltage detection signal LV in accordance with the power supply voltage Vcc. For example, the low voltage detection circuit 18 generates a low (L) level voltage detection signal LV when the power supply voltage Vcc is greater than or equal to a predetermined voltage and generates a high (H) level voltage detection signal LV when the power supply voltage Vcc is lower than the predetermined voltage. Based on the voltage detection signal LV, the reset signal generation circuit 16 generates the second reset signal A_RST and generates the first reset signal C_RST, which is asynchronous to the internal clock signal CLK.

As shown in FIG. 2, the internal clock signal CLK is provided to an operation detection circuit 21 and a signal control circuit 22. The operation detection circuit 21 detects whether the CPU 11 is operating normally and generates an operation detection signal OC showing the detection result. The operation detection circuit 21 includes, for example, an up-counter for counting the internal clock signal CLK and generates the operation detection signal OC based on the count value. The operation detection circuit 21 then clears the count value based on a clear signal provided from the CPU 11. The operation detection circuit 21 compares the count value with a predetermined value, and generates the operation detection signal OC at an L level when the count value is less than the predetermined value and generates the operation detection signal OC at an H level when the count value is greater than or equal to the predetermined value. The CPU 11 provides the operation detection circuit 21 with a clear signal at predetermined intervals. The CPU 11 executes a program for realizing this operation. The interval for providing the clear signal to the operation detection circuit 21 is shorter than the time during which the count value reaches the predetermined value.

When the CPU 11 is operating normally, a clear signal is provided from the CPU 11 to the operation detection circuit 21 before the count value reaches the predetermined value. In this case, the count value of the operation detection circuit 21 does not exceed the predetermined value. When the CPU 11 is operating abnormally, a clear signal is not provided from the CPU 11 to the operation detection circuit 21 at the appropriate interval. In this case, the count value of the operation detection circuit 21 exceeds the predetermined value. Thus, the operation detection signal OC output from the operation detection circuit 21 indicates whether the CPU 11 is operating normally or abnormally.

The operation detection signal OC is provided to an OR circuit 31 of the signal control circuit 22. The OR circuit 31 is further provided with the voltage detection signal LV from the low voltage detection circuit 18. The OR circuit 31 performs a logical OR operation with the signals OC and LV to generate a signal S1 indicating the operation result. The signal S1 is provided to an AND circuit 32. The AND circuit 32 is further provided with the system reset signal RSTX. In detail, an inverter circuit 33 generates a logically inverted signal of the system reset signal RSTX, and an output signal S2 of the inverter circuit 33 is provided to the AND circuit 32.

An output signal S3 of the AND circuit 32 is provided to an OR circuit 34. The OR circuit 34 is further provided with a power on reset signal POR from a power on reset circuit 23. The power on reset circuit 23 generates a power on reset signal POR for stopping the operation of the entire device until the power supply voltage Vcc reaches a predetermined voltage. The power on reset circuit 23 generates the power on reset signal POR at an H level (level of the power supply voltage Vcc) before the power supply voltage Vcc reaches the predetermined voltage and generates the power on reset signal POR at an L level after the power supply voltage Vcc reaches the predetermined voltage. The power on reset signal POR is provided to the CPU 11. The CPU 11 is set in a non-operation state when the power on reset signal POR has an H level and is set in an operation state when the power on reset signal POR has an L level. In other words, the CPU 11 is reset when the power on reset signal POR has an H level. Further, the CPU 11 is permitted to control the internal circuit including the peripheral circuit 15 when the power on reset signal POR has an L level.

The OR circuit 34 generates the second reset signal A_RST. The second reset signal A_RST is provided to D flip-flop circuits (hereafter simply "FF circuits") 35 and 36. Each of the FF circuits 35 and 36 has a preset terminal PR provided with the second reset signal A_RST. Further, each of the FF circuits 35 and 36 has a clock input terminal provided with an output signal S4 of the buffer circuit 37, which is generated by amplifying the internal clock signal CLK. The first FF circuit 35 has an input terminal D provided with the output signal S2 of the inverter circuit 33, or the logically inverted signal S2 of the system reset signal RSTX. The first FF circuit 35 has an output terminal Q connected to the input terminal D of the second FF circuit 36. The second FF circuit 36 generates the first reset signal C_RST.

Figure 3:
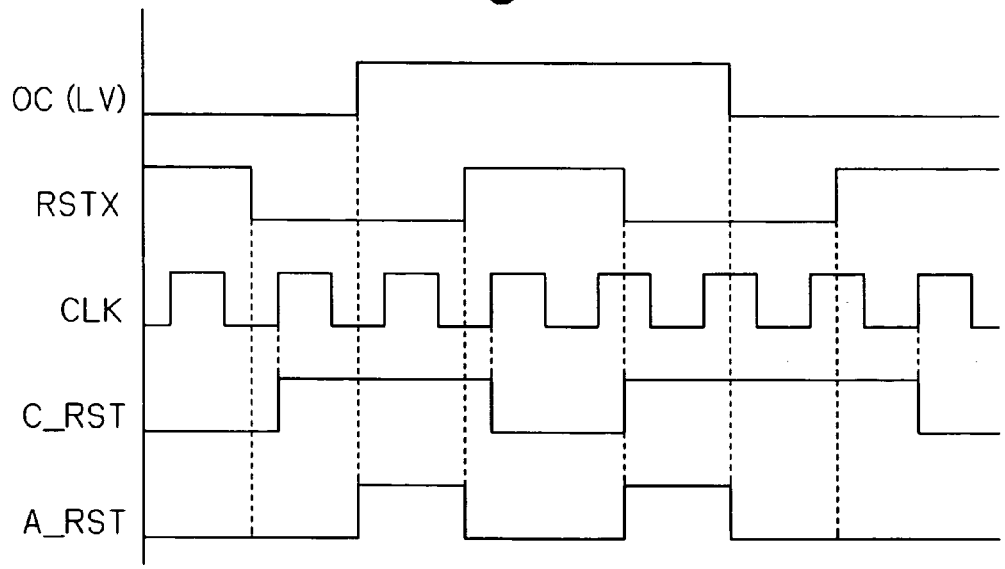
FIG. 3 is an operational waveform diagram of the reset signal generation circuit of FIG. 2.

The operation of the reset signal generation circuit 16 will now be described with reference to FIG. 3.

When the voltage detection signal LV and the operation detection signal OC both have an L level and the power on reset signal POR (not shown in FIG. 3) has an L level, an H level system reset signal RSTX is provided to the reset signal generation circuit 16. In this state, the reset signal generation circuit 16 generates the first reset signal C_RST at an L level and the second reset signal A_RST at an L level.

Next, the system reset signal RSTX falls to an L level when the voltage detection signal LV and the operation detection signal OC are at an L level. Then, an H level signal S2 is provided to the input terminal D of the first FF circuit 35. As a result, the first FF circuit 35 generates an H level signal synchronously with the rising edge of the internal clock signal CLK. The second FF circuit 36 generates an H level first reset signal C_RST in response to the H level output signal from the first FF circuit 35. More specifically, the reset signal generation circuit 16 generates the first reset signal C_RST that is synchronous to the internal clock signal CLK. In this state, the voltage detection signal LV and the operation detection signal OC are at an L level (and the power on reset signal POR has an L level). Thus, the AND circuit 32 generates an L level signal S3. As a result, the reset signal generation circuit 16 generates an L level second reset signal A_RST.

Then, the voltage detection signal LV or the operation detection signal OC rises to an H level when the system reset signal RSTX has an L level. As a result, the AND circuit 32 generates an H level signal S3 based on the H level signals S1 and S2. Thus, the reset signal generation circuit 16 generates the second reset signal A_RST at an H level.

Subsequently, the system reset signal RSTX rises to an H level when the voltage detection signal LV or the operation detection signal OC has an H level. Then, the AND circuit 32 generates an L level signal S3. As a result, the reset signal generation circuit 16 generates the second reset signal A_RST at an L level. Further, the input terminal D of the first FF circuit 35 is provided with an L level signal S2. As a result, the first FF circuit 35 generates an L level signal synchronous with the rising edge of the internal clock signal CLK. Thus, the second FF circuit 36 generates an L level first reset signal C_RST in response to the L level output signal from the first FF circuit 35.

Afterwards, the system reset signal RSTX falls to an L level when the voltage detection signal LV or the operation detection signal OC has an H level. Then, the AND circuit 32 generates an H level signal S3. As a result, the reset signal generation circuit 16 generates an H level second reset signal A_RST. The H level second reset signal A_RST is provided to the preset terminals PR of the first FF circuit 35 and the second FF circuit 36. As a result, the first FF circuit 35 and the second FF circuit 36 generate H level signals. More specifically, the reset signal generation circuit 16 generates an H level first reset signal C_RST that is asynchronous to the internal clock signal CLK in response to an L level system reset signal RSTX.

Next, the voltage detection signal LV or the operation detection signal OC falls to an L level when the system reset signal RSTX has an L level. Then, the AND circuit 32 generates an L level signal S3. As a result, the reset signal generation circuit 16 generates an L level second reset signal A_RST.

Subsequently, the system reset signal RSTX rises to an H level when the voltage detection signal LV or the operation detection signal OC has an L level. Then, the input terminal D of the first FF circuit 35 is provided with an L level signal S2. As a result, the first FF circuit 35 generates an L level signal synchronous to a rising edge of the internal clock signal CLK. The second FF circuit 36 generates an L level first reset signal C_RST in response to the L level output signal from the first FF circuit 35. More specifically, the reset signal generation circuit 16 generates an L level first reset signal C_RST synchronous to the internal clock signal CLK.

More specifically, the reset signal generation circuit 16 generates a first reset signal C_RST that is synchronous to the internal clock signal CLK in response to the system reset signal RSTX when the operation detection signal OC (or the voltage detection signal LV) has an L level. The reset signal generation circuit 16 generates a first reset signal C_RST that is asynchronous to the internal clock signal CLK in response to the system reset signal RSTX when the operation detection signal OC (or the voltage detection signal LV) has an H level.

When the power on reset signal POR has an H level, the reset signal generation circuit 16 generates the second reset signal A_RST at an H level. The H level second reset signal A_RST is provided to the preset terminals RP of the first FF circuit 35 and the second FF circuit 36. As a result, the first FF circuit 35 and the second FF circuit 36 generate H level signals. More specifically, the reset signal generation circuit 16 generates an H level first reset signal C_RST that is asynchronous to the internal clock signal CLK. When the reset signal generation circuit 16 is provided with an H level system reset signal RSTX and the power on reset signal POR falls to an L level in that state, the reset signal generation circuit 16 first generates an L level second reset signal A_RST. The reset signal generation circuit 16 then generates an L level first reset signal C_RST that is synchronous to the internal clock signal CLK.

The reset signal generation circuit 16 of the first embodiment has the advantages described below.

(1) The operation detection circuit 21 generates the operation detection signal OC indicating whether the CPU 11 is operating normally. The signal control circuit 22 generates the first reset signal C_RST that is synchronous or asynchronous to the internal clock signal CLK based on the operation detection signal OC and the system reset signal RSTX. When the CPU 11 is operating normally, the first reset signal C_RST that is synchronous to the internal clock signal CLK is generated. In this case, the CPU 11, the ROM 13, the RAM 14, and the peripheral circuit 15 are reset while the stored data of the RAM 14 and the data on the setting of the peripheral circuit 15 are held. When the CPU 11 is operating abnormally, the first reset signal C_RST that is asynchronous to the internal clock signal CLK is generated. In this case, all the synchronous circuits including the CPU 11 are immediately initialized.

(2) The signal control circuit 22 further generates the first reset signal C_RST based on the voltage detection signal LV having a level that is in accordance with the level of the power supply voltage Vcc. This enables the reset signal generation circuit 16 to selectively generate the first reset signal C_RST synchronous to the clock signal CLK or the first reset signal C_RST asynchronous to the clock signal CLK based on the operation detection signal OC and the voltage detection signal LV.

A reset signal generation circuit 40 according to a second embodiment of the present invention will now be described with reference to the drawings.

Figure 4:
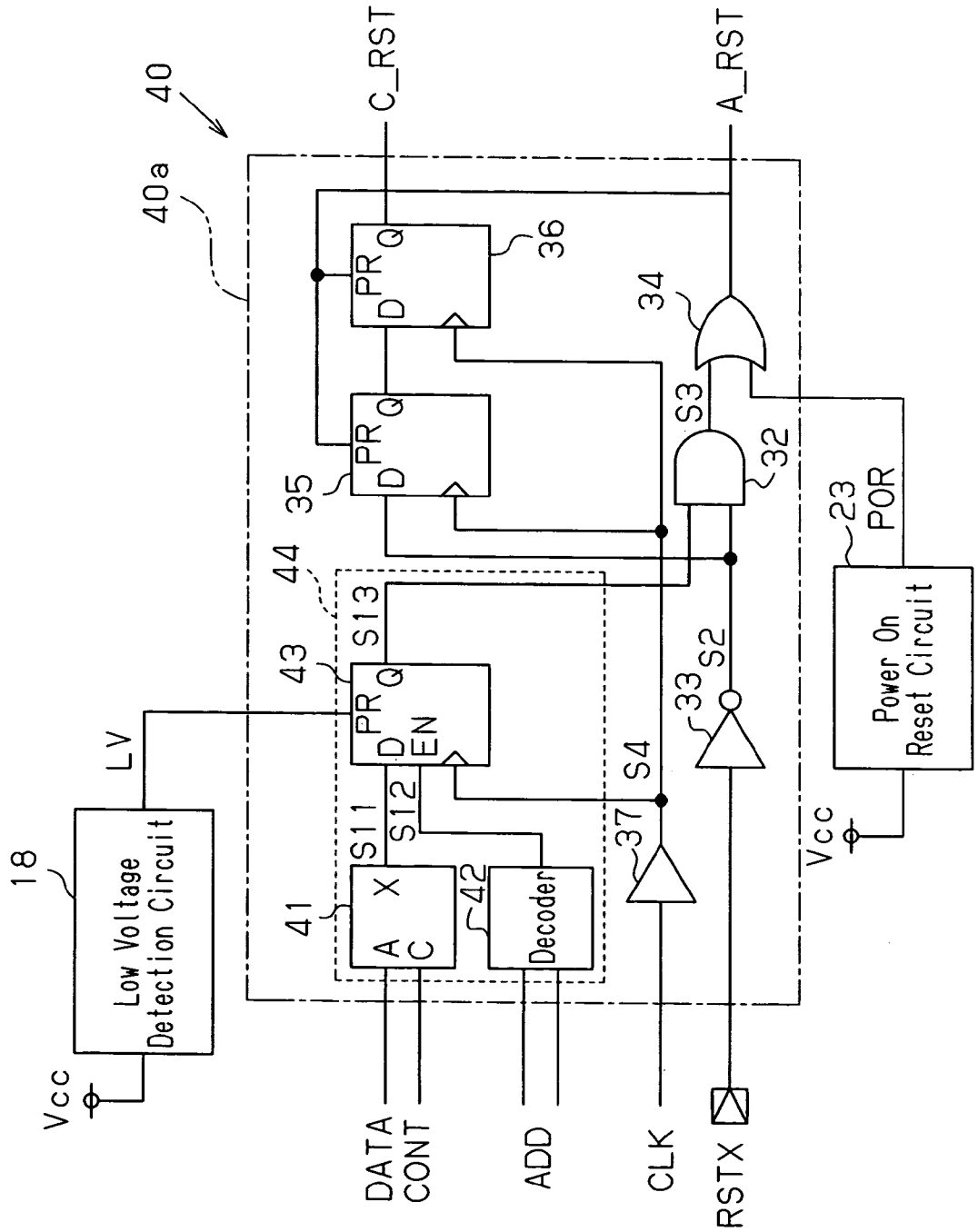
FIG. 4 is a schematic circuit block diagram of a reset signal generation circuit according to a second embodiment of the present invention.

As shown in FIG. 4, the reset signal generation circuit 40 of the second embodiment includes a signal control circuit 40*a*. The signal control circuit 40*a* includes a function control circuit 44, which is formed by a latch circuit 41, a decoder circuit 42, and a D flip-flop circuit (FF circuit) 43.

The latch circuit 41 is provided with data DATA (write data) and an output control signal CONT from a CPU 11 (refer to FIG. 1). The latch circuit 41 latches the data DATA in response to the output control signal CONT, to generate a signal S11 (reset control signal). The decoder circuit 42 is provided with an address signal ADD from the CPU 11. The decoder circuit 42 decodes the address signal ADD, which is formed by a plurality of bits, to generate a decoded signal S12. In detail, the decoder circuit 42 generates the decoded signal S12 at an H level when the address signal ADD indicates a predetermined address and generates the decoded signal S12 at an L level when the address signal ADD indicates an address other than the predetermined address.

The FF circuit 43 is a flip-flop circuit having an enable terminal EN. In the FF circuit 43, the enable terminal EN is provided with the decoded signal S12 and the input terminal D (data terminal) is provided with the signal S11. The FF circuit 43 has a clock input terminal, which is provided with an output signal S4 of a buffer circuit 37 that has the same phase as an internal clock signal CLK, and a preset terminal PR, which is provided with a voltage detection signal LV.

The FF circuit 43 is set in a rewritable state based on an H level decoded signal S12 and is set in a non-rewritable state based on an L level decoded signal S12. In the non-rewritable state, the FF circuit 43 generates the signal S13 based on the voltage detection signal LV provided to the preset terminal PR. The signal S13 generated immediately after the semiconductor device is activated is set at an H level based on an H level voltage detection signal LV. As a result, the FF circuit 43 maintains the signal S13 at an H level regardless of subsequent changes in the level of the voltage detection signal LV.

In the rewritable state, the FF circuit 43 generates the signal S13 having a level substantially equal to the value (data DATA) written to the FF circuit 43 by the CPU 11, that is, a level substantially equal to the level of the signal S11, synchronously with the internal clock signal CLK. Thus, the signal S13 is maintained at an H level if the write value has not been changed subsequent to activation. If the CPU 11 has written L level data DATA subsequent to activation, the signal S13 is set at an L level.

As a result, the reset signal generation circuit 40 generates the first reset signal C_RST and the second reset signal A_RST based on the output signal S13 of the FF circuit 43, the system reset signal RSTX, and the power on reset signal POR. Then, the reset signal generation circuit 40 invalidates the system reset signal RSTX based on the signal S11 provided to the FF circuit 43. In other words, the function of generating the first and second reset signals C_RST and A_RST as asynchronous signals is stopped by the FF circuit 43.

Figure 5:
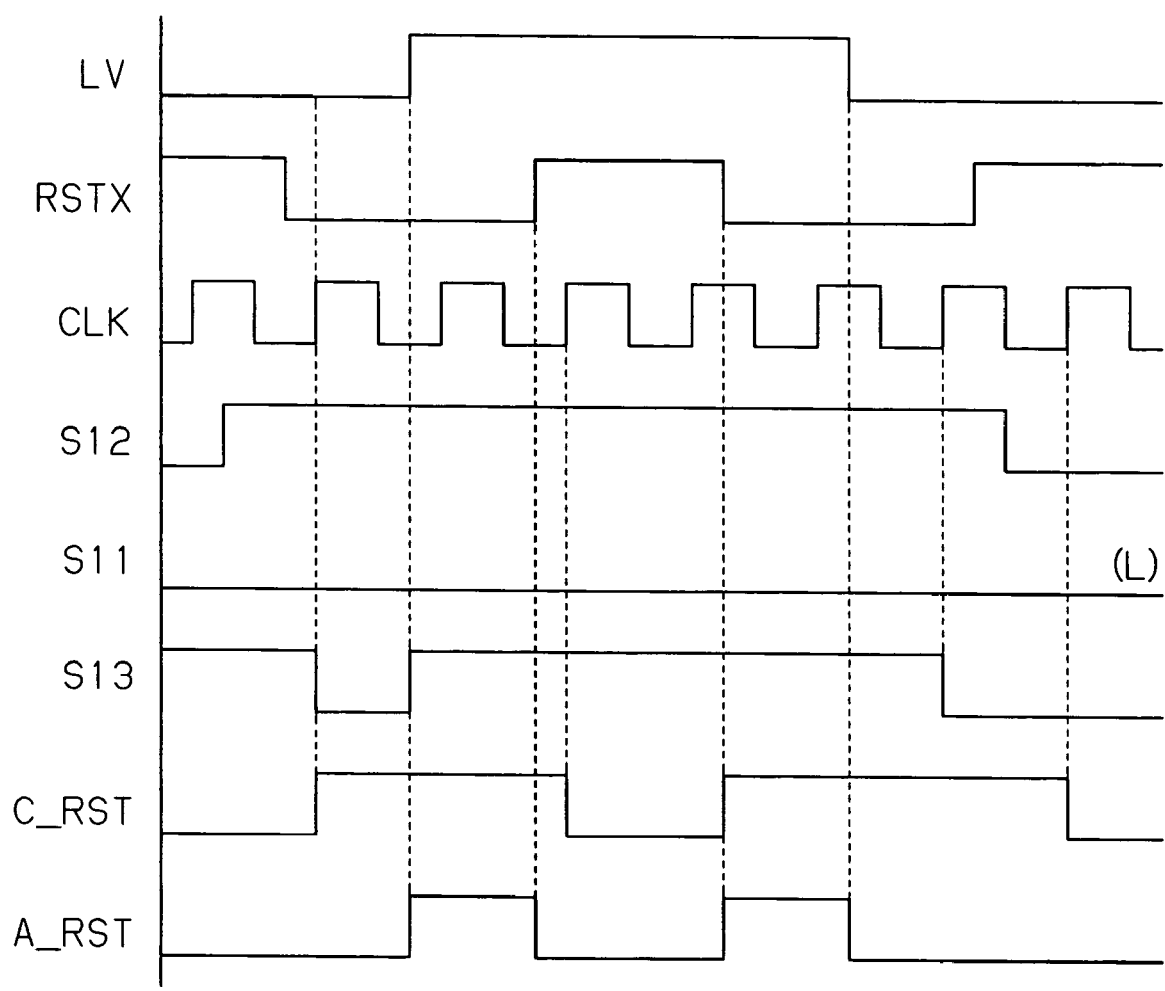
FIG. 5 is an operational waveform diagram of the reset signal generation circuit of FIG. 4.

In the operation state, when the voltage detection signal LV has an L level and the decoded signal S12 has an H level, the FF circuit 43 generates the signal S13 having substantially the same level as the signal S11 synchronous with the signal S4, that is, the internal clock signal CLK as shown in FIG. 5. Further, the FF circuit 43 generates the H level signal S13 in response to the H level voltage detection signal LV. Thus, in the same manner as the reset signal generation circuit 16 of the first embodiment, the reset signal generation circuit 40 generates the first reset signal C_RST that is synchronous to the internal clock signal CLK when the voltage detection signal LV has an L level and generates the first reset signal C_RST that is asynchronous to the internal clock signal CLK when the voltage detection signal LV has an H level.

The reset signal generation circuit 40 of the second embodiment has the advantages described below in addition to the advantages of the first embodiment.

The reset signal generation circuit 40 includes the FF circuit 43 having the input terminal D, the enable terminal EN, and the preset terminal PR. The input terminal D is provided with the reset control signal S11, which is generated based on the write data DATA and the output control signal CONT from the CPU 11. The enable terminal EN is provided with the decoded signal S12, which is generated based on the address signal ADD from the CPU 11. The preset terminal PR is provided with the voltage detection signal LV. As a result, the function of generating the first and second reset signals C_RST and A_RST as asynchronous signals is stopped by the FF circuit 43 when the enable terminal EN is provided with an H level decoded signal S12, the input terminal D is provided with an L level reset control signal S11, and the preset terminal PR is provided with an L level voltage detection signal LV.

A reset signal generation circuit 50*a* according to a third embodiment will now be described with reference to the drawings.

Figure 6:
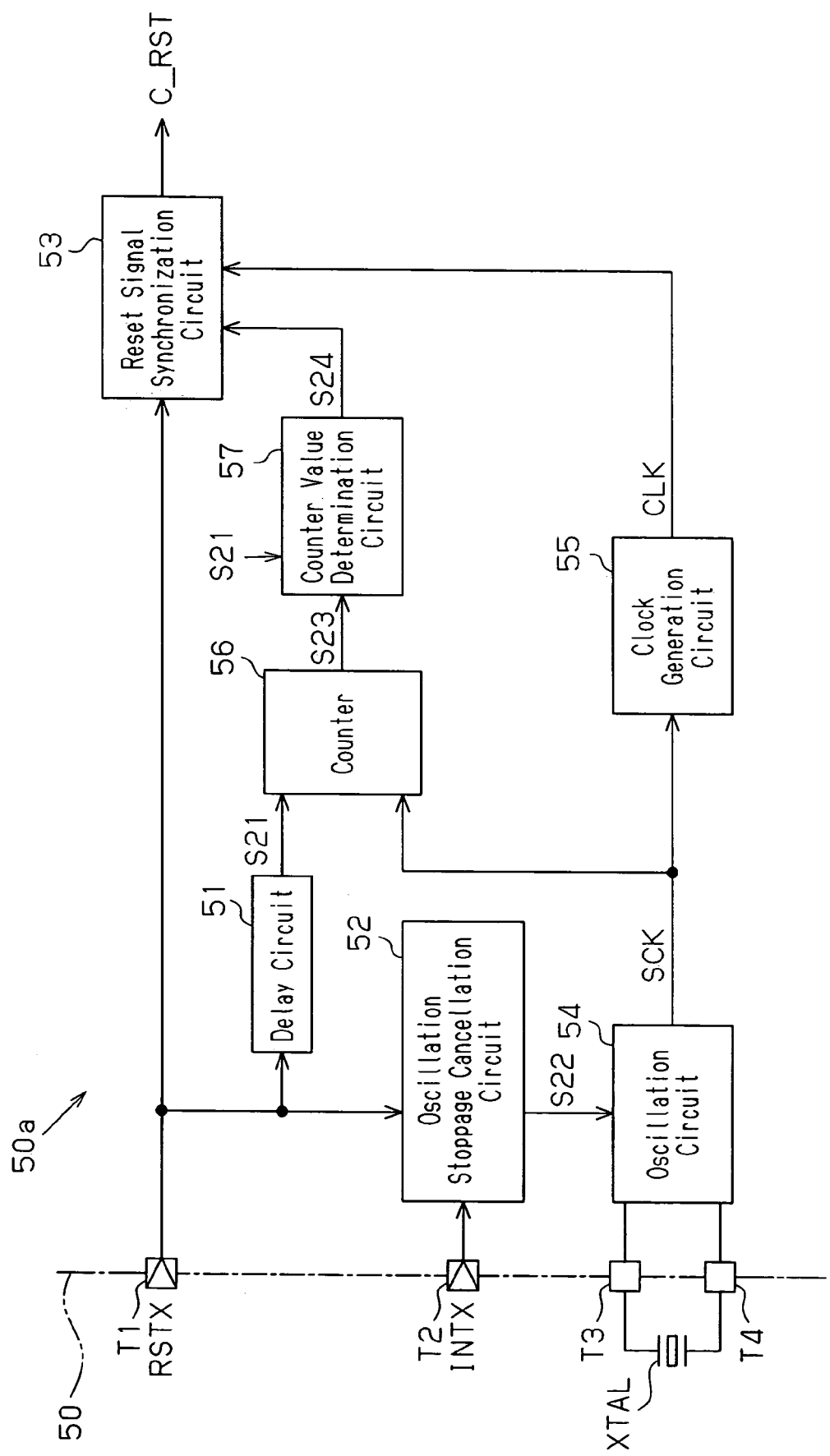
FIG. 6 is a schematic block diagram of a semiconductor device including a reset signal generation circuit according to a third embodiment of the present invention.

FIG. 6 is a schematic block diagram of a semiconductor device 50 including the reset signal generation circuit 50*a* of the third embodiment. Although not shown in FIG. 6, the semiconductor device 50 includes synchronous circuits such as a CPU 11 in the same manner as in the first embodiment.

The semiconductor device 50 has a terminal T1, which is provided with a system reset signal RSTX, and a terminal T2, which is provided with an external interruption signal INTX. The semiconductor device 50 further has its terminals T3 and T4, between which a crystal oscillator XTAL is connected.

The reset signal generation circuit 50*a* of the third embodiment includes a delay circuit 51, an oscillation stoppage cancellation circuit 52, a reset signal synchronization circuit 53, an oscillation circuit 54, a clock generation circuit 55, a counter 56, and a counter value determination circuit 57.

The system reset signal RSTX is provided to the delay circuit 51, the oscillation stoppage cancellation circuit 52, and the reset signal synchronization circuit 53. The delay circuit 51 forms the oscillation stabilization control circuit 16*c* shown in FIG. 1. The delay circuit 51 delays the system reset signal RSTX by a predetermined time (first time) to generate a delay signal S21. The predetermined time is set as the time required from when the oscillation circuit 54, which will be described later, starts oscillating to when the oscillation frequency is stabilized.

The oscillation stoppage cancellation circuit 52, which functions as an oscillation control circuit, is provided with the system reset signal RSTX and the external interruption signal INTX. The oscillation stoppage cancellation circuit 52 determines whether the factor stopping the semiconductor device 50, that is, the factor stopping oscillation of the oscillation circuit 54, has been eliminated based on the signals RSTX and INTX and generates a stoppage cancel signal S22 based on the determination result. The stoppage cancel signal S22 is provided to the oscillation circuit 54. For example, the semiconductor device 50 performs a normal operation in response to an H level system reset signal RSTX and performs a reset operation in response to an L level system reset signal RSTX. Further, the semiconductor device 50 performs a normal operation in response to an H level external interruption signal INTX and performs an interrupt operation in response to an L level external interruption signal INTX. More specifically, the L level system reset signal RSTX and the L level external interruption signal INTX correspond to the oscillation stoppage factors. The oscillation stoppage cancellation circuit 52 generates an L level stoppage cancel signal S22 when an oscillation stoppage factor has not been eliminated and generates an H level stoppage cancel signal S22 when the oscillation stoppage factor has been eliminated.

The oscillation circuit 54, which is connected to the crystal oscillator XTAL by the terminals T3 and T4, receives the stoppage cancel signal S22 from the oscillation stoppage cancellation circuit 52. In response to an H level stoppage cancel signal S22, the oscillation circuit 54 performs an oscillation operation and generates a system clock signal SCK having a frequency that is in accordance with the crystal oscillator XTAL. The oscillation circuit 54 stops the oscillation operation in response to an L level stoppage cancel signal S22. The system clock signal SCK is provided to the clock generation circuit 55 and the counter 56.

The clock generation circuit 55 generates an internal clock signal CLK by dividing the frequency of the system clock signal SCK.

The counter 56 forms the oscillation stabilization control circuit 16*c* shown in FIG. 1. The counter 56 is provided with the delay signal S21 and the internal clock signal CLK. Based on the delay signal S21, the counter 56 starts counting the pulses of the system clock signal SCK when a predetermined time elapses after the system resetting has been canceled. The counter 56 provides the counter value determination circuit 57, which functions as a determination circuit, with a count signal S23 indicating the count value.

The counter value determination circuit 57 stores a predetermined value. The counter value determination circuit 57 receives the delay signal S21. When a predetermined time (second time) elapses after the counter 56 starts to perform a count operation, the counter value determination circuit 57 determines whether the count value indicated by the signal S23 is greater than or equal to the predetermined value based on the delay signal S21. The counter value determination circuit 57 generates a determination signal S24 in accordance with the determination result and provides the determination signal S24 to the reset signal synchronization circuit 53. For example, the counter value determination circuit 57 generates an H level determination signal S24 when the counter value is greater than or equal to the predetermined value and generates an L level determination signal S24 when the counter value is less than the predetermined value.

The reset signal synchronization circuit 53 is provided with the system reset signal RSTX, the determination signal S24, and the internal clock signal CLK. The reset signal synchronization circuit 53 has substantially the same structure as the signal control circuit 22 shown in FIG. 2. The reset signal synchronization circuit 53 determines whether the oscillation circuit 54 is operating normally based on the determination signal S24, and generates the first reset signal C_RST that is synchronous or asynchronous to the internal clock signal CLK based on the determination result. When the determination signal S24 has an H level, the reset signal synchronization circuit 53 determines that the counter 56 is counting the pulses of the system clock signal SCK at predetermined intervals, that is, the oscillation circuit 54 is performing a normal oscillation operation. When the determination signal S24 has an L level, the reset signal synchronization circuit 53 determines that the counter 56 is not counting the pulses of the system clock signal SCK at predetermined intervals, that is, the oscillation circuit 54 is not performing a normal oscillation operation.

More specifically, the reset signal synchronization circuit 53 generates the first reset signal C_RST that is synchronous to the internal clock signal CLK based on the system reset signal RSTX when the determination signal S24 has an H level. The reset signal synchronization circuit 53 generates the first reset signal C_RST that is asynchronous to the internal clock signal CLK based on the system reset signal RSTX when the determination signal S24 has an L level.

The first reset signal C_RST generated by the reset signal synchronization circuit 53 is provided to the synchronous circuits including the CPU 11 shown in FIG. 1. The synchronous circuits are initialized in response to the asynchronous first reset signal C_RST. Further, the synchronous circuits are reset in response to the first reset signal C_RST that is synchronous to the internal clock signal CLK in a state in which internal setting information is being held.

The reset signal generation circuit 50*a* of the third embodiment has the advantages described below.

(1) Based on the determination result of the counter value determination circuit 57, the reset signal synchronization circuit 53 generates the first reset signal C_RST that is synchronous to the internal clock signal CLK when the oscillation circuit 54 is operating normally. Further, the reset signal synchronization circuit 53 generates the first reset signal C_RST that is asynchronous to the internal clock signal CLK when the oscillation circuit 54 is operating abnormally. Thus, when an oscillation stoppage factor has been eliminated, the switching between oscillation and non-oscillation states of the oscillation circuit 54 is easily determined. Further, even when the oscillation circuit 54 is not oscillating, the asynchronous first reset signal C_RST is provided to the synchronous circuits including the CPU 11 so as to ensure the resetting of the synchronous circuits.

(2) Based on the output signal S21 of the delay circuit 51, the counter 56 starts counting the system clock signal SCK when the predetermined time elapses after the factor stopping the semiconductor device 50 (oscillation stoppage factor) is eliminated. When the predetermined time (second time) elapses after the counter 56 starts counting, the counter value determination circuit 57 compares the count value with the predetermined value and generates the determination signal S24 in accordance with the comparison result. Accordingly, normal or abnormal operation of the oscillation circuit 54 may easily be determined from the counter value of the counter 56.

A reset signal generation circuit 60 according to a fourth embodiment of the present invention will now be described with reference to FIG. 7.

Figure 7:
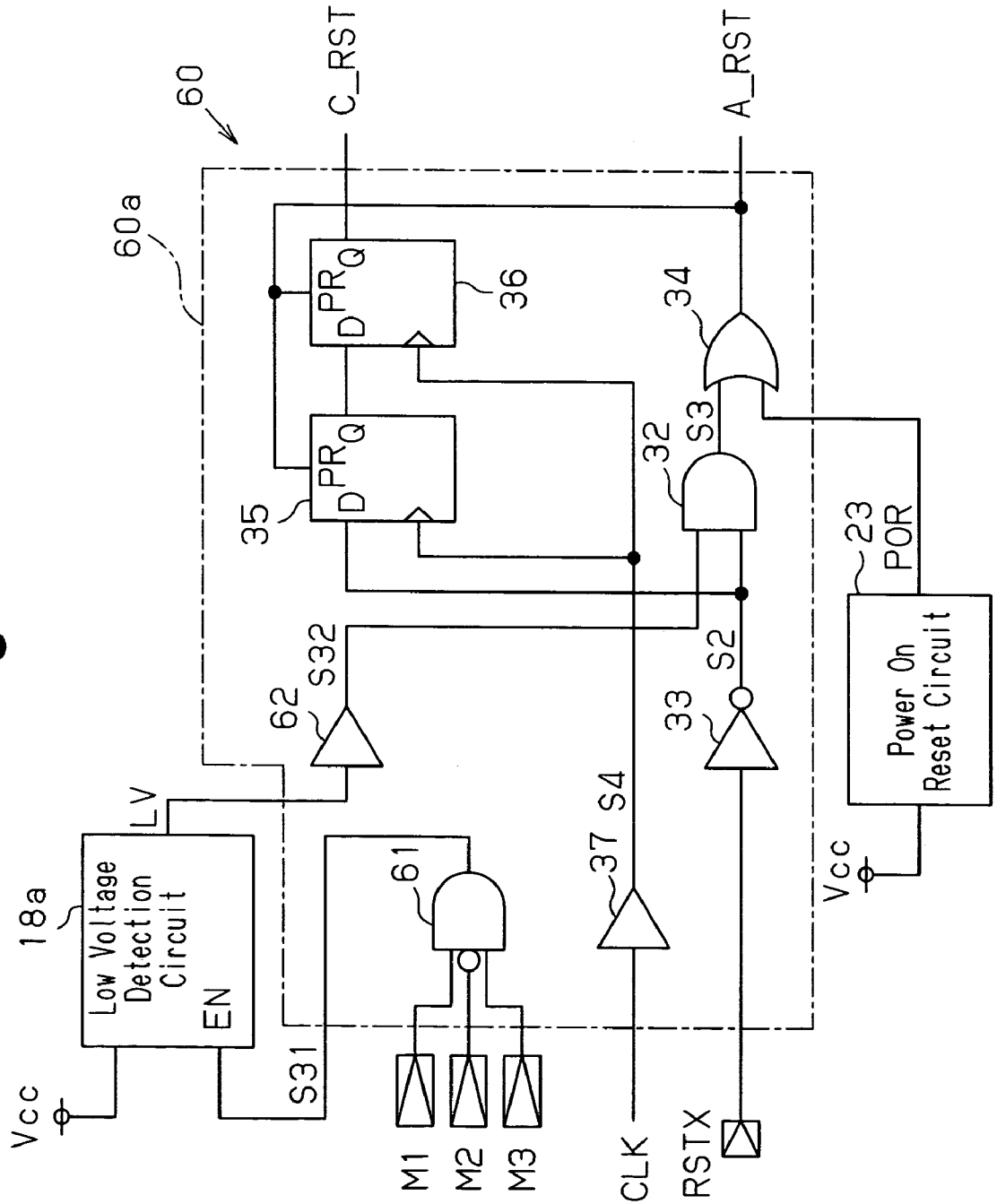
FIG. 7 is a schematic circuit block diagram of a reset signal generation circuit according to a fourth embodiment of the present invention.

As shown in FIG. 7, the reset signal generation circuit 60 of the fourth embodiment includes a signal control circuit 60*a*. The signal control circuit 60*a* stops the operation of a low voltage detection circuit 18a when necessary. When the low voltage detection circuit 18a stops operating, the current flowing through the circuit is reduced. As a result, consumption power is reduced.

In detail, the low voltage detection circuit 18a has a terminal EN for controlling the operation stoppage of the low voltage detection circuit 18a. For example, the low voltage detection circuit 18a starts operating when an H level signal is provided to the terminal EN and stops operating when an L level signal is provided to the terminal EN. The terminal EN is connected to a decoder circuit 61 (operation control circuit). The decoder circuit 61 is provided with mode control signals M1, M2, and M3. The decoder circuit 61 generates an H level signal S31 in response to a combination of H level mode control signals M1 and M3 and an L level mode control signal M2. Further, the decoder circuit 61 generates an L level signal S31 in response to other combinations of the mode control signals M1, M2, and M3. The low voltage detection circuit 18a starts operating in response to an H level signal S31 and stops operating in response to an L level signal S31. A voltage detection signal LV of the low voltage detection circuit 18a is provided to a buffer circuit 62. As a result, the buffer circuit 62 generates a signal S32. Accordingly, the operation of the low voltage detection circuit 18a is controlled based on the mode control signals M1 to M3. When the operation of the low voltage detection circuit 18a is stopped, the current flowing through the circuit is reduced. As a result, consumption power is reduced.

The operation of the low voltage detection circuit 18a may be controlled based on an enable signal provided from a device, which is external to the chip, to the terminal EN of the low voltage detection circuit 18a. Further, the levels of the mode control signals M1 to M3 may be set in accordance with the operation condition (reset vector) that is set based on, for example, a reset sequence used for activation.

A reset signal generation circuit 70 according to a fifth embodiment of the present invention will now be described with reference to FIG. 8.

Figure 8:
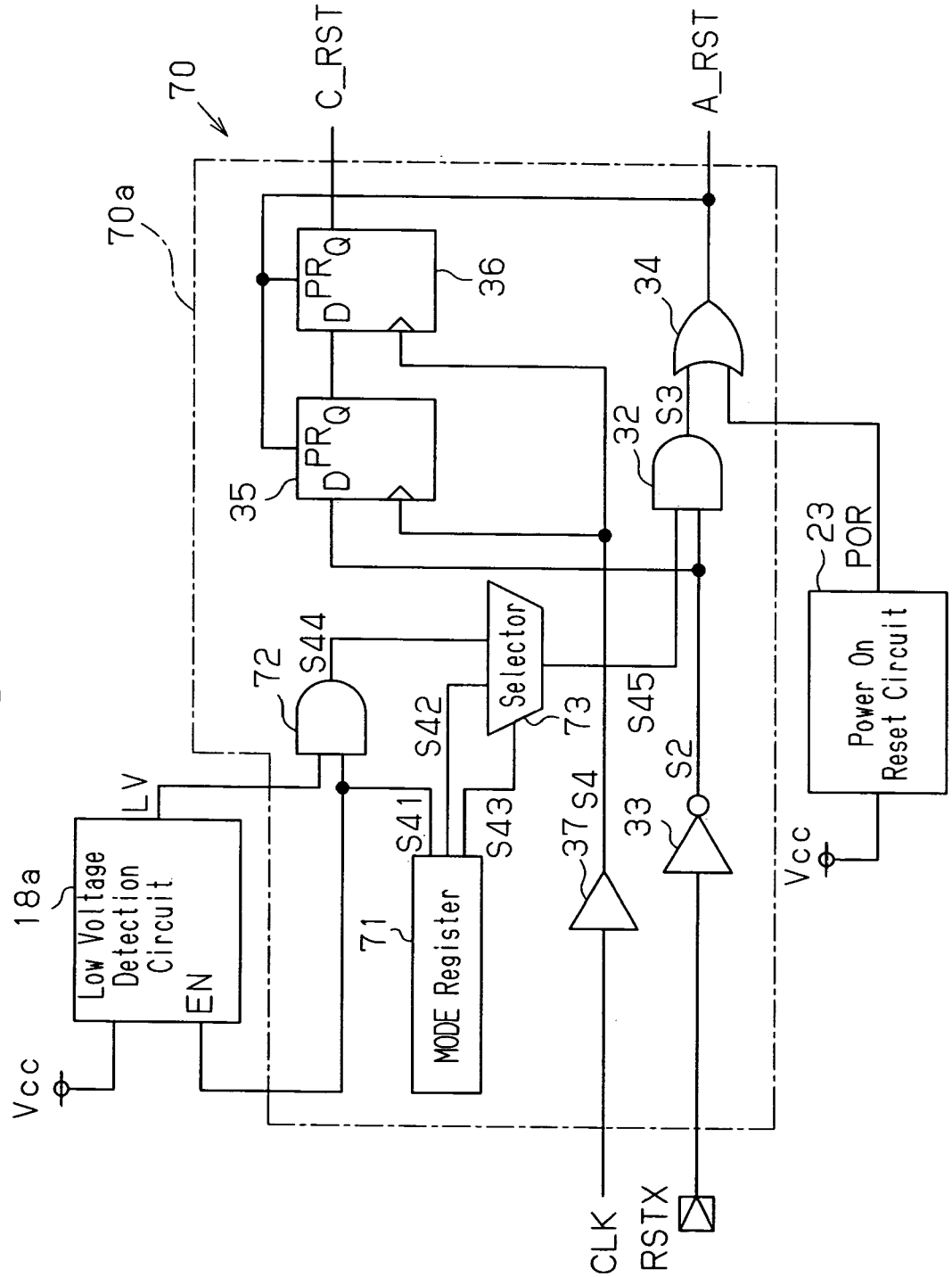
FIG. 8 is a schematic circuit block diagram of a reset signal generation circuit according to a fifth embodiment of the present invention.

As shown in FIG. 8, the reset signal generation circuit 70 of the fifth embodiment includes a signal control circuit 70a. The signal control circuit 70a includes a mode resister 71 (operation control circuit and first to third storage units) storing operation modes. An output signal S41 (operation control signal) of the mode resister 71 is provided to a terminal EN of the low voltage detection circuit 18a. A circuit for controlling writing performed by circuits shown in FIG. 1 such as the CPU 11 writes a first mode value (control information) to the mode resister 71 at a timing that is based on, for example, a reset sequence used for activation. The mode resister 71 generates an H level or L level signal S41 in accordance with the first mode value. The low voltage detection circuit 18a starts operating in response to an H level signal S41 and stops operating in response to an L level signal S41. Accordingly, the operation of the low voltage detection circuit 18a is controlled based on the first mode value. When the operation of the low voltage detection circuit 18a is stopped, the current flowing through the circuit is reduced. As a result, consumption power is reduced.

A voltage detection signal LV of the low voltage detection circuit 18a and the signal S41 of the mode resister 71 are provided to an AND circuit 72. The AND circuit 72 prevents an erroneous operation of the reset signal generation circuit 70 from being performed when the low voltage detection circuit 18a stops operating. When the low voltage detection circuit 18a stops operating, the level of the voltage detection signal LV may become unstable. If the level of the voltage detection signal LV becomes unstable, an input of an AND circuit 32 becomes unstable. In this case, a first reset signal C_RST and a second reset signal A_RST fail are not stably generated. The low voltage detection circuit 18a stops operating in response to an L level signal S41. The output signal S41 of the mode resister 71 is provided to the AND circuit 72 so that an output signal S44 of the AND circuit 72 is fixed at an L level when the low voltage detection circuit 18a stops operating.

The mode resister 71 stores a second mode value (setting information) and a third mode value (selection information) in addition to the first mode value. The mode resister 71 generates a signal S42 (setting signal) in accordance with the second mode value and a signal S43 (selection signal) having a level in accordance with the third mode value. The output signals S42 and S43 of the mode resister 71 and the output signal S44 of the AND circuit 72 are provided to a selector 73. The selector 73 selects one of the signal S42 and the signal S44 based on the signal S43 and generates a signal S45 having substantially the same level as the selected signal. The signal S45 is provided to the AND circuit 32. The AND circuit 32 generates a signal S3 based on the signal S45 and a logically inverted signal S2 of a system reset signal RSTX.

Accordingly, the reset signal generation circuit 70 of the fifth embodiment generates the first reset signal C_RST and the second reset signal A_RST based on the second and third mode values stored in the mode resister 71. More specifically, the reset signal generation circuit 70 appropriately invalidates the detection result of the low voltage detection circuit 18a based on the third mode value. When the detection result of the low voltage detection circuit 18a is invalidated, the operation of the low voltage detection circuit 18a is stopped. In this case, the current flowing through the low voltage detection circuit 18a is reduced. As a result, consumption power is reduced. Further, when the detection result of the low voltage detection circuit 18a is invalidated, the operation mode is switched based on the signal S42, that is, the second mode value, between the state in which a reset signal that is asynchronous to the internal clock signal is constantly generated and the state in which a reset signal that is synchronous to the internal clock signal is constantly generated. Thus, the reset signal generation circuit 70 of the fifth embodiment also has the same advantages as the first embodiment.

It should be apparent to those skilled in the art that the present invention may be embodied in many other specific forms without departing from the spirit or scope of the invention. Particularly, it should be understood that the present invention may be embodied in the following forms.

In the first embodiment, the low voltage detection circuit 18 may be eliminated. In the first and second embodiments, the power on reset circuit 23 may be eliminated.

In the second embodiment, the function control circuit 44 does not have to be formed by the latch circuit 41, the decoder circuit 42, and the FF circuit 43.

In the semiconductor device of the first embodiment, the structure of the bus 12 may be changed when necessary. For example, the bus 12 may be formed by a plurality of buses or may be separated into an address bus and a data bus. Alternatively, the semiconductor device may include a circuit for converting the bus width in accordance with the circuit that is connected to the bus 12.

The signal control circuits 40a, 60a, and 70a of the second, fourth, and fifth embodiment may include the operation detection circuit 21 and the OR circuit 31 of the first embodiment.

The present examples and embodiments are to be considered as illustrative and not restrictive, and the invention is not to be limited to the details given herein, but may be modified within the scope and equivalence of the appended claims.

What is claimed is:

1. A reset signal generation circuit for generating a first reset signal provided to a synchronous circuit that operates in accordance with a clock signal, the reset signal generation circuit comprising:
   an operation detection circuit for detecting whether the synchronous circuit is operating normally or abnormally and for generating an operation detection signal; and
   a signal control circuit, connected to the operation detection circuit, for generating the first reset signal based on a system reset signal, the clock signal, and the operation detection signal,
   wherein the signal control circuit generates the first reset signal that is synchronous to the clock signal in response to the system reset signal when the synchronous circuit is operating normally, and
   wherein the signal control circuit generates the first reset signal that is asynchronous to the clock signal in response to the system reset signal when the synchronous circuit is operating abnormally.

2. The reset signal generation circuit according to claim 1, further comprising:
   an asynchronous circuit responsive to a second reset signal that is asynchronous to the clock signal, wherein the signal control circuit generates the second reset signal based on the system reset signal.

3. The reset signal generation circuit according to claim 1, wherein the signal control circuit generates the first reset signal based on the operation detection signal and a voltage detection signal indicating a decrease in power supply voltage.

4. The reset signal generation circuit according to claim 2, further comprising:
   a power on reset circuit, connected to the signal control circuit, for generating a power on reset signal for stopping operation of the synchronous circuit and the asynchronous circuit until the power supply voltage reaches a predetermined voltage, wherein the signal control circuit generates the second reset signal in response to the power on reset signal.

5. The reset signal generation circuit according to claim 2, wherein the signal control circuit includes:
   a gate circuit, connected to the operation detection circuit, for generating the second reset signal based on the operation detection signal and the system reset signal; and
   a flip-flop circuit, connected to the gate circuit, for generating the first reset signal according to the system reset signal in synchronism with the clock signal when the second reset signal has a first level and for generating the first reset signal asynchronously to the clock signal when the second reset signal has a second level, which is an inverted level of the first level.

6. The reset signal generation circuit according to claim 1, wherein the signal control circuit receives a voltage detection signal indicating a decrease in power supply voltage and generates the first reset signal that is asynchronous to the clock signal in response to the system reset signal when the power supply voltage is lower than a predetermined voltage.

7. The reset signal generation circuit according to claim 1, further comprising:
   a power on reset circuit which generates a power on reset signal for stopping operation of the synchronous circuit until power supply voltage reaches a predetermined voltage,
   wherein the signal control circuit generates the first reset signal that is asynchronous to the clock signal in response to the system reset signal when operation of the synchronous circuit is stopping by the power on reset signal.

* * * * *